(12) United States Patent
Lee et al.

(10) Patent No.: US 7,977,126 B2
(45) Date of Patent: Jul. 12, 2011

(54) METHOD OF MANUFACTURING ORGANIC LIGHT EMITTING DEVICE HAVING PHOTO DIODE

(75) Inventors: Yun-gyu Lee, Suwon-si (KR); Hye-hyang Park, Suwon-si (KR); Ki-ju Im, Suwon-si (KR); Byoung-deog Choi, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 207 days.

(21) Appl. No.: 12/098,653

(22) Filed: Apr. 7, 2008

(65) Prior Publication Data

US 2009/0011528 A1 Jan. 8, 2009

(30) Foreign Application Priority Data

Jul. 4, 2007 (KR) .................. 10-2007-0066881

(51) Int. Cl.
*H01L 21/00* (2006.01)
*H01L 51/40* (2006.01)
*H01L 21/425* (2006.01)

(52) U.S. Cl. ............... 438/24; 438/25; 438/29; 438/72; 438/99; 438/531; 257/E33.076; 257/E31.127

(58) Field of Classification Search ............ 438/24–25, 438/29, 72, 99, 531; 257/E33.076, E31.127
See application file for complete search history.

(56) References Cited

U.S. PATENT DOCUMENTS

| 5,262,654 | A  | * | 11/1993 | Yamazaki ............... 257/53 |
| 6,475,838 | B1 | * | 11/2002 | Bryant et al. ........... 438/153 |
| 7,271,537 | B2 | * | 9/2007  | Matsuda et al. ......... 313/506 |
| 2002/0044208 | A1 | * | 4/2002 | Yamazaki et al. ....... 348/272 |
| 2005/0077577 | A1 | * | 4/2005 | Manna et al. ........... 257/355 |
| 2007/0138951 | A1 | * | 6/2007 | Park et al. .............. 313/504 |

(Continued)

FOREIGN PATENT DOCUMENTS

JP 10-163517 6/1998

(Continued)

OTHER PUBLICATIONS

Notice of Allowance issued in corresponding Korean Patent Application No. 10-2007-0066881 dated May 30, 2008.

*Primary Examiner* — Hsien-ming Lee
*Assistant Examiner* — Kevin Parendo
(74) *Attorney, Agent, or Firm* — H.C. Park & Associates, PLC

(57) ABSTRACT

A method for manufacturing an organic light emitting device including a photo diode and a transistor includes forming a first semiconductor layer and a second semiconductor layer on separate portions of a buffer layer formed on the substrate; forming a gate metal layer on the first semiconductor layer, the gate metal layer covering a central region of the first semiconductor layer; forming a high-concentration P doping region and a high-concentration N doping region in the first semiconductor layer by injecting impurities into regions of the first semiconductor layer not covered by the gate metal layer to form the photodiode; forming a source and drain region and a channel region in the second semiconductor layer; and removing the gate metal layer from the central region of the first semiconductor layer by etching and simultaneously forming a gate electrode by etching, the gate electrode being insulated from the channel region of the second semiconductor layer, to form the transistor.

9 Claims, 2 Drawing Sheets

U.S. PATENT DOCUMENTS

2007/0229484 A1 * 10/2007 Fujita et al. .................. 345/207

FOREIGN PATENT DOCUMENTS

| | | |
|---|---|---|
| JP | 2005-116681 | 4/2005 |
| JP | 2006-80306 | 3/2006 |
| KR | 2005-2606 | 1/2005 |
| KR | 2005-9211 | 1/2005 |
| KR | 2005-31397 | 4/2005 |
| KR | 2005-58395 | 6/2005 |
| KR | 2005-65304 | 6/2005 |
| KR | 2005-121090 | 12/2005 |
| KR | 2006-58573 | 5/2006 |
| KR | 2006-77138 | 7/2006 |
| KR | 2006-88082 | 8/2006 |

* cited by examiner

METHOD OF MANUFACTURING ORGANIC LIGHT EMITTING DEVICE HAVING PHOTO DIODE

CROSS-REFERENCE TO RELATED APPLICATION

This application claims the benefit of Korean Application No. 2007-66881, filed Jul. 4, 2007, in the Korean Intellectual Property Office, the disclosure of which is incorporated herein by reference.

BACKGROUND OF THE INVENTION

1. Field of the Invention

Aspects of the present invention relate to a method for manufacturing an organic light emitting device, and more particularly to a method for manufacturing an organic light emitting device having a photo diode whose intrinsic region is prevented being doped with impurities by covering and doping an upper portion of the intrinsic region with a gate metal.

2. Description of the Related Art

Organic light emitting diodes are the next-generation display devices having self-light emission properties. Organic light emitting diodes have excellent physical properties in terms of viewing angle, contrast, response time, power consumption and the like, compared to the liquid crystal display devices (LCDs).

The organic light emitting device includes organic light emitting diodes comprising an anode electrode, an organic thin film layer and a cathode electrode. Types of organic light emitting devices include passive matrix type in which organic light emitting diodes are coupled between scan lines and signal lines in a matrix mode to constitute pixels; and an active matrix type in which the operation of respective pixels is controlled by a thin film transistor (TFT) that functions as a switch.

However, the general organic light emitting devices have problems that, because an organic thin film layer that emits the light is composed of organic materials, the film quality and light emission properties deteriorate with time, which leads to reduction in luminance of the light. Also, the contrast of the organic light emitting device may be worsened by the reflection of light incident from the outside.

SUMMARY OF THE INVENTION

Accordingly, aspects of the present invention provide an organic light emitting device having a photo diode which controls luminance of the emitted light according to the intensity of light incident from the outside, and a manufacturing method thereof.

Also, aspects of the present invention provide a manufacturing method capable of preventing LDD doping of an intrinsic region in manufacturing a photo diode.

The present invention is not limited to the objects as described above, and therefore other objects, unless otherwise specified herein, are understood from the following descriptions, as apparent to those skilled in the art.

According to one embodiment of the present invention, there is provided a method of manufacturing an organic light emitting device that is formed on a substrate, coupled to a transistor including a gate, a source and a drain and includes a first electrode, an organic thin film layer and a second electrode, the method including steps of: forming a separate semiconductor layer on a buffer layer formed on the substrate; forming a gate metal layer on the semiconductor layer, the gate metal layer covering a central region of the semiconductor layer; forming a high-concentration P doping region and a high-concentration N doping region by injecting impurities into the semiconductor layer; and forming a gate electrode through an etching process, and simultaneously etching the gate metal layer.

According to an aspect of the present invention, the method for manufacturing an organic light emitting device according to the present invention may further include a step of forming a reflective film on prescribed region of the substrate.

According to an aspect of the present invention, the reflective film may be formed of at least one metal selected from the group consisting of Ag, Mo, Ti, Al and Ni.

According to an aspect of the present invention, the reflective film may be formed in a thickness of 100 to 5,000 Å.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of embodiments, taken in conjunction with the accompanying drawings of which.

DETAILED DESCRIPTION OF THE EMBODIMENTS

Figure 1:
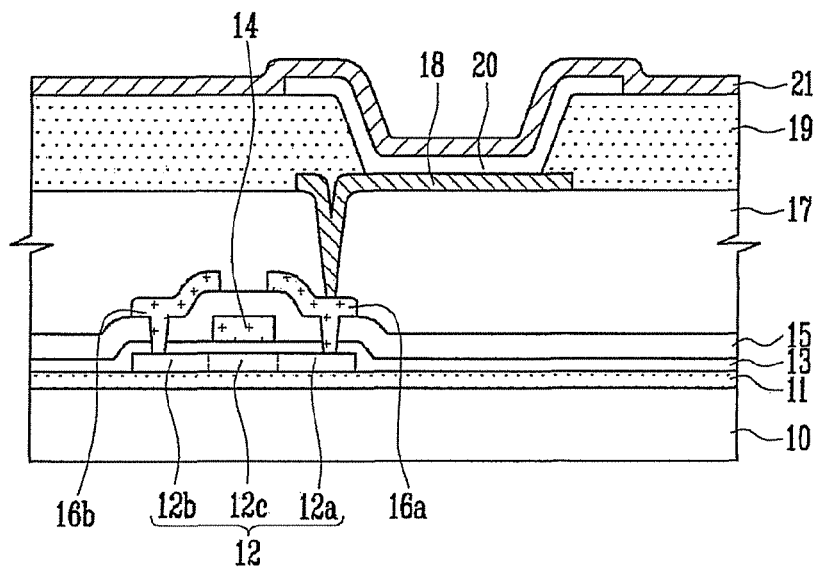
FIG. 1 is a schematic cross-sectional view illustrating a conventional organic light emitting device including a thin film transistor.

Reference will now be made in detail to the present embodiments of the present invention, examples of which are illustrated in the accompanying drawings, wherein like reference numerals refer to the like elements throughout. The embodiments are described below in order to explain the present invention by referring to the figures. Herein, it is to be understood that where is stated herein that one layer is "formed on" or "disposed on" a second layer, the first layer may be formed or disposed directly on the second layer or there may be an intervening layer between the first layer and the second layer. Further, as used herein, the term "formed on" is used with the same meaning as "located on" or "disposed on" and is not meant to be limiting regarding any particular fabrication process.

FIG. 1 is a schematic cross-sectional view illustrating a conventional organic light emitting device including a thin film transistor.

A buffer layer 11 is formed on a substrate 10, and a semiconductor layer 12 including source and drain regions 12a, 12b and a channel region 12c is formed on the buffer layer 11. A gate electrode 14, which is insulated from the semiconductor layer 12 due to the presence of a gate insulator 13, is formed on the semiconductor layer 12. An interlayer insulator 15, which has a contact hole formed therein to expose the source and drain regions 12a, 12b, is formed on the entire upper surface having a gate electrode 14. Source and drain electrodes 16a, 16b, which are coupled to the source and drain regions 12a, 12b through the contact hole, are formed on the interlayer insulator 15. An overcoat 17, which has a via hole formed therein to expose the source or drain electrode 16a or 16b, is formed on the entire upper surface including the source and drain electrodes 16a, 16b. On the overcoat 17 are formed an anode electrode 18 coupled to the source or drain electrode 16a or 16b through the via hole; and a pixel definition layer 19 that exposes a predetermined region of the anode electrode 18 to define a light emission region. An organic thin film layer 20 and a cathode electrode 21 are formed on the anode electrode 18.

As described above, the organic light emitting device comprising the anode electrode 18, the organic thin film layer 20 and the cathode electrode 21 emits light due to an energy gap. Emission of light occurs when a predetermined voltage is applied to the anode electrode 18 and the cathode electrode 21 such that electrons injected through the cathode electrode 21 are recombined with holes injected through the anode electrode 18 in the organic thin film layer 20.

A light emission layer of the conventional organic light emitting device has problems that the film quality and physical properties of the organic materials that make up the light emission layer deteriorate with time, which leads to the reduction in the luminance of the emitted light. In order to solve the above problems, the present inventors have found a method to control luminance of the emitted light to a constant level by detecting light incident from the outside, or the light emitted from the inside, using a photo diode. However, the light detection area and efficiency of the display device may decrease as the size of the photo diode becomes smaller with the decreasing size and thickness of the display device.

According to aspects of the present invention light detection efficiency is enhanced by reflecting the light that transmits through a photo diode and the light that is directed toward a substrate when the light is incident from the outside, followed by allowing incidence of the light on the photo diode.

Figure 2:
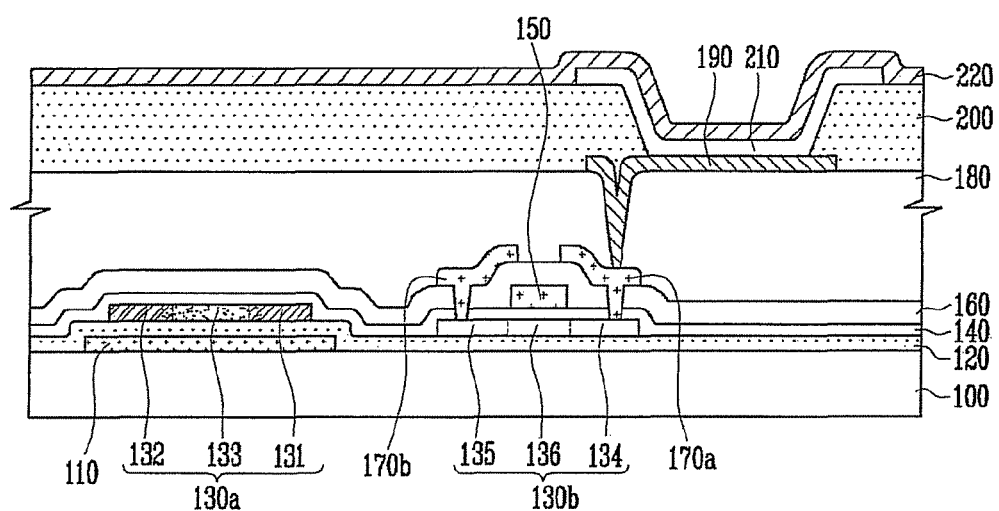
FIG. 2 is a cross-sectional view illustrating an organic light emitting device having a photo diode according to an aspect of the present invention.

FIG. 2 is a cross-sectional view illustrating an organic light emitting device having a photo diode according to aspects the present invention.

A reflective film 110 is formed on a predetermined region of a substrate 100. The reflective film 110 is formed on a non-light emission region adjoining a light emission region, and made of at least one metal such as Ag, Mo, Ti, Al or Ni. A buffer layer 120 is formed on the entire surface of the substrate 100 including the reflective film 110. A first semiconductor layer 130a, which comprises a high-concentration P doping region 131, a high-concentration N doping region 132 and an intrinsic region 133, is formed on the buffer layer 120 formed on the reflective film 110. A second semiconductor layer 130b having source and drain regions 134, 135 and a channel region 136 is formed on the buffer layer 120 adjoining the first semiconductor layer 130a. A gate electrode 150, which is insulated from the second semiconductor layer 130b by means of the gate insulator 140, is formed on the second semiconductor layer 130b. An interlayer insulator 160 having a contact hole formed therein to expose the source and drain regions 134, 135 is formed on the entire upper surface including the gate electrode 150. Source and drain electrodes 170a, 170b, which are coupled to the source and drain regions 134, 135 through the contact hole, are formed on the interlayer insulator 160. An overcoat 180, which has a via hole formed therein to expose the source or drain electrode 170a or 170b, is formed on the entire upper surface including the source and drain electrodes 170a, 170b. On the overcoat 180 is formed a first electrode 190 (typically, an anode) coupled to the source or drain electrode 170a or 170b through the via hole; and a pixel definition layer 200 that exposes a predetermined region of the first electrode 190 to define a light emission region. An organic thin film layer 210 and a second electrode 220 (typically, a cathode) are formed on the first electrode 190. The organic thin film layer 210 is formed with a structure in which a hole transfer layer, an organic light emission layer and an electron transfer layer are laminated, and may further include a hole injection layer and an electron injection layer.

As described above, in the case where the first electrode 180 is the anode and the second electrode 220 is the cathode, electrons injected through the cathode (second electrode 220) are recombined with holes injected through the anode (first electrode 180) in the organic thin film layer 210 if a predetermined voltage is applied to the anode the cathode. Then, the organic light emitting diode emits the light due to the presence of the energy gap generated in this process. It is to be understood that the organic light emitting diode is not limited to this configuration and that the position of the anode and the cathode may be reversed.

The first semiconductor layer 130a comprising the high-concentration P doping region 131, the high-concentration N doping region 132 and the intrinsic region 133 has a photo diode formed therein. Light is incident on the organic light emitting device from an external light source while the light is emitted out as described above. The photo diode detects the light incident from the outside to generate an electrical signal according to the intensity of the light.

The photo diode is a semiconductor diode that converts an optical signal into an electrical signal, and therefore, if light is incident on the photo diode under a reverse-bias state, that is to say, a state in which a negative (−) voltage is applied to the high-concentration P doping region 131 and a positive (+) voltage is applied to the high-concentration N doping region 132, then an electrical current flows in the photo diode as the electrons and the holes move along a depletion region formed in the intrinsic region 133. As a result, the photo diode outputs a voltage that is proportional to the intensity of the light. Accordingly, the luminance of the light emitted according to the intensity of the light incident from the outside may be controlled by controlling a voltage that is applied to the first electrode 180 and the second electrode 220 of the organic light emitting diode according to the voltage outputted from the photo diode.

As described above, according to aspects of the present invention, light that is incident from the outside and that transmits through a photo diode or that is directed toward a substrate 100 is reflected, and then, the reflected light is incident on the photo diode, which leads to the improvement of light detection efficiency.

In general, the first semiconductor layer 130a, which forms the photo diode, is formed of polysilicon, and therefore, it is difficult to ensure a sufficient light detection efficiency since the first semiconductor layer 130a is typically formed at a very thin thickness of about 500 Å. Also, the light detection efficiency of the display devices including a photo diode may be additionally worsened as photo diodes are made smaller to accommodate the decreasing size and thickness of display devices. However, it is possible to reduce the size of the photo diode since the light detection efficiency is enhanced through the presence of the reflective film 110. Also, although the case that a photo diode is configured so that it can detect the light incident from the outside is described in the embodiment, the present invention is not limited thereto, but the photo diode may be configured so that it can detect the light emitted from inside the display device and control a voltage applied to the first electrode 180 and the second electrode 220 of the organic light emitting diode, and also configured so that the organic light emitting device can be operated with touch panel using a photo diode.

Figure 3A:
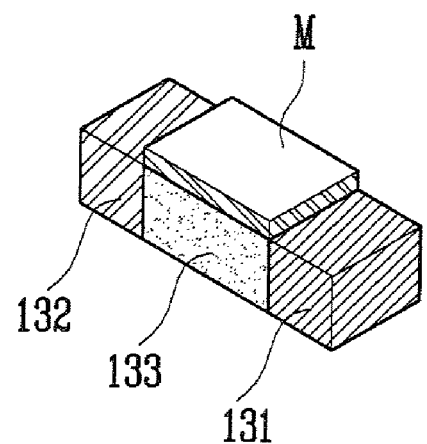
FIG. 3A and FIG. 3B are schematic views illustrating a doping process of the photo diode according to an embodiment of the present invention.
Figure 3B:
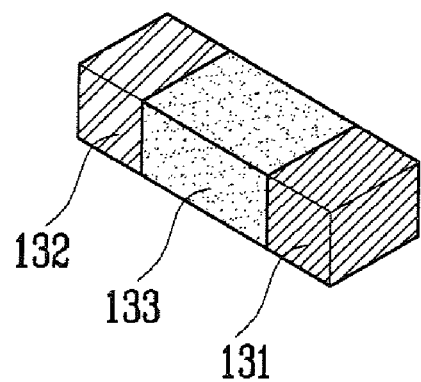

FIG. 3A and FIG. 3B are schematic views illustrating a doping process of a photo diode one embodiment of the present invention.

In general, the semiconductor layer of the photo diode is formed of a high-concentration P doping region, an intrinsic region and a high-concentration N doping region.

In the conventional doping process of the photo diode, N-type and P-type impurity ions are injected into a semiconductor layer to form a high-concentration P doping region and a high-concentration N doping region. An intrinsic region that is not doped with the impurity ions is maintained between the high-concentration P doping region and the high-concentration N doping region of the semiconductor layer, and therefore the semiconductor layer of the photo diode is formed with a PIN junction.

However, during the doping of the semiconductor layer with N-type and P-type impurity ions in the conventional manufacturing process of the photo diode, the intrinsic layer may be unintentionally doped with the N-type and P-type impurity ions. Therefore, an LDD (LDD=lightly doped drain) doping region may be unintentionally formed between the high-concentration P doping region and the high-concentration N doping region instead of an intrinsic region.

According to one embodiment of the present invention and as shown in FIG. 3A, an upper portion of the intrinsic region 133 is covered with a gate metal (M) before the first semiconductor layer 130a is doped with N-type and P-type impurity ions in order to prevent an LDD doping region from being formed between the high-concentration P doping region 131 and the high-concentration N doping region 132. The gate metal (M) prevents the intrinsic region 133 from being doped with impurity ions.

The gate metal (M) is removed off from the intrinsic layer 133 after doping to form the high concentration P doping region 131 and the high concentration N doping region 132 so that the photo diode can detect light from the outside. The first semiconductor layer 130a after etching of the gate metal (M) is shown in FIG. 3B. The gate metal (M) may be removed through an additional process or may be removed at the same time as other etching processes in the formation of the organic light emitting device, such as, for example, during conventional etching of the source/drain of the transistor or ITO material comprising the anode.

Using the above-mentioned method, LDD doping may be prevented in the intrinsic region of the photo diode without any of additional new processes.

Aspects of the present invention provide a method of manufacturing an organic light emitting device having a photo diode that controls luminance of the emitted light according to the intensity of the light incident from the outside, and also provides a photo diode in which LDD doping of the intrinsic region is prevented.

Although a few embodiments of the present invention have been shown and described, it would be appreciated by those skilled in the art that changes might be made in this embodiment without departing from the principles and spirit of the invention, the scope of which is defined in the claims and their equivalents.

What is claimed is:

1. A method of manufacturing a display device, the method comprising:
   forming a semiconductor layer over a substrate;
   forming a gate metal layer directly and selectively on a central region of the semiconductor layer;
   forming a P doping region and a N doping region by injecting impurities into the semiconductor layer to form a photodiode; and
   removing the gate metal layer from the semiconductor layer; and
   wherein the display device further comprises:
   a transistor comprising: source and drain regions, a channel region connected between the source and drain regions, a gate electrode corresponding to the channel region and a gate insulation layer insulating the gate electrode from the channel region; and
   wherein the gate metal layer is used as a mask covering the central region corresponding to an intrinsic region of the photodiode when the impurities are injected.

2. The method of claim 1, further comprising forming a reflective film over the substrate before forming the semiconductor layer over the substrate, wherein the reflective film is positioned to reflect light incident from outside the display device to the subsequently formed photodiode.

3. The method of claim 2, wherein the reflective film comprises at least one metal selected from the group consisting of Ag, Mo, Ti, Al and Ni.

4. The method of claim 2, wherein the reflective film has a thickness of 100 to 5,000 Å.

5. A method of forming a photodiode, the method comprising:
   forming a semiconductor layer over a substrate;
   forming a gate metal layer directly and selectively on a central region of the semiconductor layer;
   forming a P doping region and a N doping region by injecting impurities into regions of the semiconductor layer not covered by the gate metal layer to form the photodiode; and
   removing the gate metal layer from the central region of the semiconductor layer; and
   wherein the gate metal layer is used as a mask covering the central region corresponding to an intrinsic region of the photodiode when the impurities are injected.

6. A method of manufacturing a display device including a photodiode and a transistor, the method comprising:
   forming a first semiconductor layer and a second semiconductor layer separated from each other over a substrate;
   forming a gate metal layer directly and selectively on a central region of the first semiconductor layer;
   forming a P doping region and a N doping region in the first semiconductor layer by injecting impurities into regions of the first semiconductor layer not covered by the gate metal layer to form the photodiode;
   forming source and drain regions and a channel region in the second semiconductor layer; and
   removing the gate metal layer from the central region of the first semiconductor layer after injecting the impurities; and
   wherein the transistor includes the second semiconductor layer having the source and drain regions and the channel region, a gate electrode corresponding to the channel region and a gate insulation layer insulating the gate electrode from the channel region; and wherein the gate metal layer is used as a mask covering the central region corresponding to an intrinsic region of the photodiode when the impurities are injected.

7. The method of claim 6, further comprising forming a reflective film over the substrate before forming the first semiconductor layer and the second semiconductor layer over the substrate, wherein the reflective film is positioned to reflect light incident from outside the display device to the subsequently formed photodiode.

8. The method of claim 7, wherein the reflective film is formed of one selected from the group consisting of Ag, Mo, Ti, Al and Ni.

9. The method of claim 7, wherein the reflective film is formed with a thickness of 100 to 5,000 Å.

* * * * *